United States Patent
Fong et al.

(10) Patent No.: US 7,471,541 B2
(45) Date of Patent: Dec. 30, 2008

(54) MEMORY TRANSISTOR GATE OXIDE STRESS RELEASE AND IMPROVED RELIABILITY

(75) Inventors: David Fong, Cupertino, CA (US); Jianguo Wang, Cupertino, CA (US); Jack Zezhong Peng, San Jose, CA (US); Harry Shengwen Luan, Saratoga, CA (US)

(73) Assignee: Kilopass Technology, Inc., Santa Clara, CA (US)

( * ) Notice: Subject to any disclaimer, the term of this patent is extended or adjusted under 35 U.S.C. 154(b) by 16 days.

(21) Appl. No.: 11/759,050

(22) Filed: Jun. 6, 2007

(65) Prior Publication Data

US 2007/0230232 A1 Oct. 4, 2007

Related U.S. Application Data

(62) Division of application No. 11/368,576, filed on Mar. 6, 2006, now Pat. No. 7,269,047.

(51) Int. Cl.
*G11C 7/00* (2006.01)
(52) U.S. Cl. ............. 365/104; 365/189.07; 365/189.17
(58) Field of Classification Search ................. 365/104, 365/189.17
See application file for complete search history.

(56) References Cited

U.S. PATENT DOCUMENTS

| 4,488,222 | A  | * | 12/1984 | Cochcroft et al. ............. 714/53 |
| 5,280,449 | A  |   | 1/1994  | Oldham et al. |
| 5,717,625 | A  |   | 2/1998  | Hasegawa et al. |
| 6,049,490 | A  |   | 4/2000  | Kawasumi et al. |
| 6,175,535 | B1 | * | 1/2001  | Dhong et al. ............... 365/236 |
| 6,862,242 | B2 |   | 3/2005  | Chen et al. |

* cited by examiner

*Primary Examiner*—Tan T. Nguyen
(74) *Attorney, Agent, or Firm*—Perkins Coie LLP (57) ABSTRACT

Methods and apparatus for decreasing oxide stress and increasing reliability of memory transistors are disclosed. Duration and frequency of exposure of memory transistor gates to read signals are significantly reduced. In some embodiments, after a short read cycle, the content of the memory cell is latched and maintained as long as the subsequent read attempts are directed to the same memory cell. In these embodiments the read cycle need only be long enough to latch the memory content of the cell, and as long as the subsequent read attempts target the same memory cell the latched value will be used instead of repeating the read process.

8 Claims, 10 Drawing Sheets

FIG. 1

(* Min. V(wlp) is the minimum voltage of wlp in order to read correct data.)

FIG. 2

(* Min. V(wlp) is the minimum voltage of wlp to have acceptable speed.)

MEMORY TRANSISTOR GATE OXIDE STRESS RELEASE AND IMPROVED RELIABILITY

CROSS-REFERENCE TO RELATED APPLICATIONS

This application is a Divisional of U.S. patent application Ser. No. 11/368,576, filed Mar. 6, 2006, now U.S. Pat. No. 7,269,047 benefit of priority is claimed.

TECHNICAL FIELD OF THE INVENTION

The presented embodiments relate, in general, to memory cells and, more particularly, to reducing stress on memory devices.

BACKGROUND OF THE INVENTION

Nonvolatile memory circuits have been widely used in various circuit applications including computer memory, automotive applications, FPGAs (field programmable gate arrays), communication equipment, video games, code storage memories, serial configuration memories, and individual fuse bits for ID, trimming, and other post-fab SoC customization needs. The MOS (Metal-Oxide-Semiconductor) devices, which are the current basis of Ultra-Large-Scale Integration circuits such as memory circuits, are beginning to show fundamental limits associated with the laws of quantum mechanics and the limitations of fabrication techniques.

In MOS structures, the gate insulator, which is formed by an oxide layer, endures high electric fields during operation. This stress causes several detrimental physical effects such as the trapping of charges in the oxide bulk, creation of interface states, and eventually soft or hard breakdown. These phenomena affect the MOS characteristics and cause degradation of MOS parameters. Therefore, the voltage levels a gate is subjected to and the duration and the frequency of such voltages are directly proportional to the stress they exert on the device and the damages they produce.

DETAILED DESCRIPTION

Memory cells are used for different reasons such as for storage, controlling another entity, emulating logic devices, configuration, arrangements, and also for the interconnections of logic array blocks and logic elements in FPGAs. In many memory designs, such as the one disclosed in U.S. Pat. No. 6,667,902, granted to Jack Zezhong Peng ("Peng"), the reading of a memory cell requires applying a certain voltage to a specific transistor gate.

Figure 1:
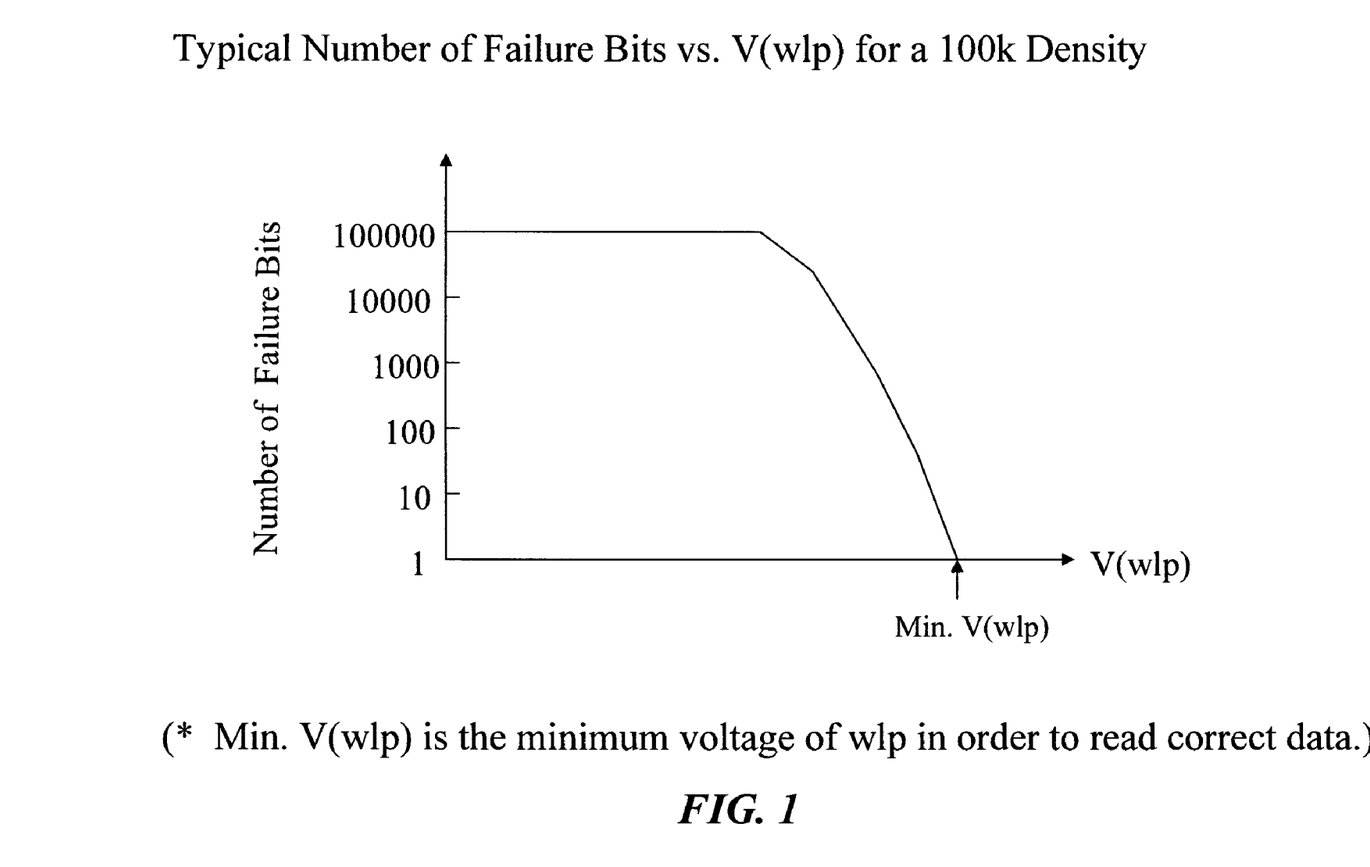
FIG. 1 illustrates failed read attempts as a function of read voltages applied to a memory transistor gate.
Figure 2:
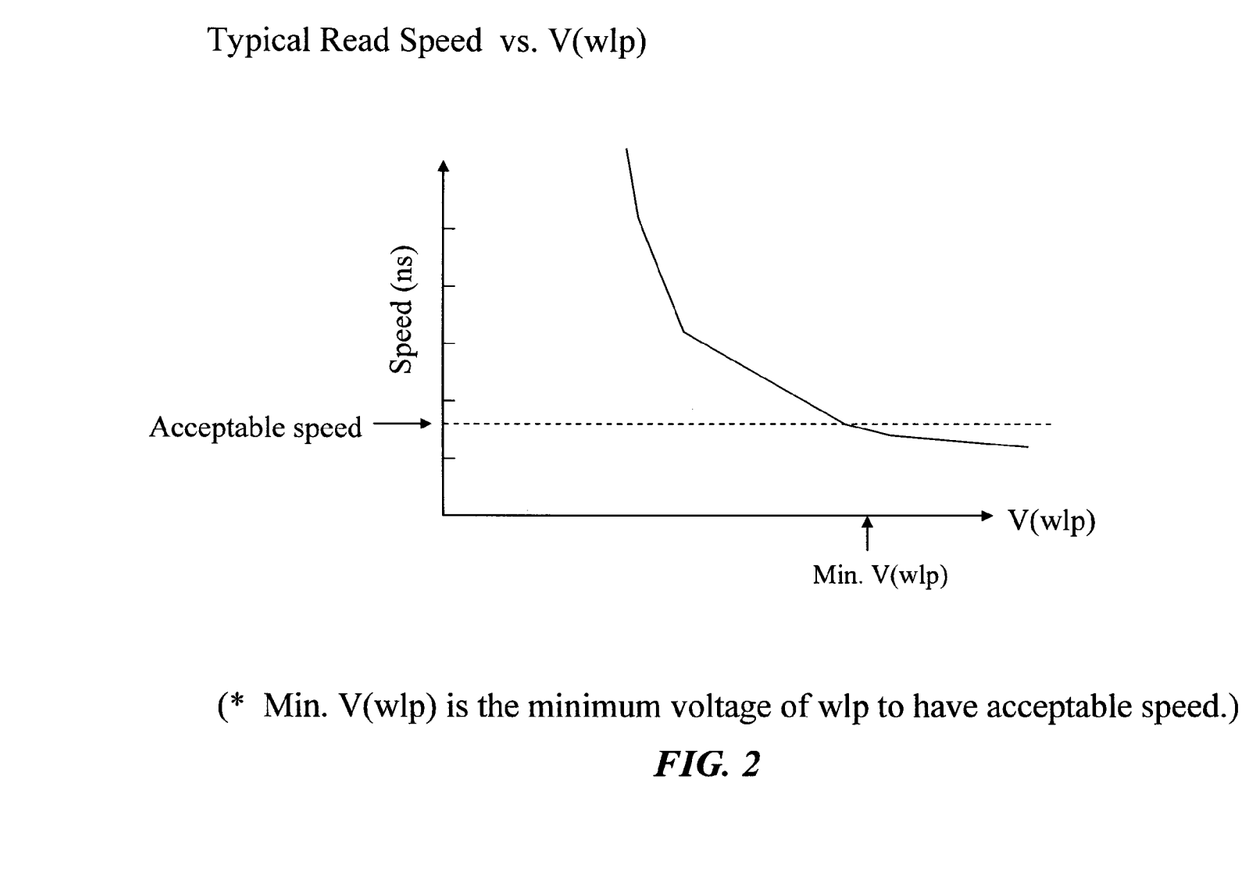
FIG. 2 illustrates speeds of read processes as a function of read voltages applied to a memory transistor gate.

As shown in FIG. 1, if this read signal is less than a minimum voltage, the reading process may be unsuccessful or at least unreliable. FIG. 1 also illustrates that the number of read failures can be significant if the gate signal voltage for the read process drops below the minimum voltage. Additionally, FIG. 2 illustrates that the reading speed of a memory cell is also highly affected by the voltage level of the read signal and that if the read signal is below a minimum voltage, the speed significantly drops.

The proposed embodiments of this invention significantly reduce, without any performance degradation, the duration and frequency of a transistor gate exposure to memory read signals. While these embodiments are being presented in the context of Peng's nonvolatile one-time-programming (OTP) memory cells, the presented concepts and details can be applied to and utilized in other memory systems and technologies.

Figure 3:
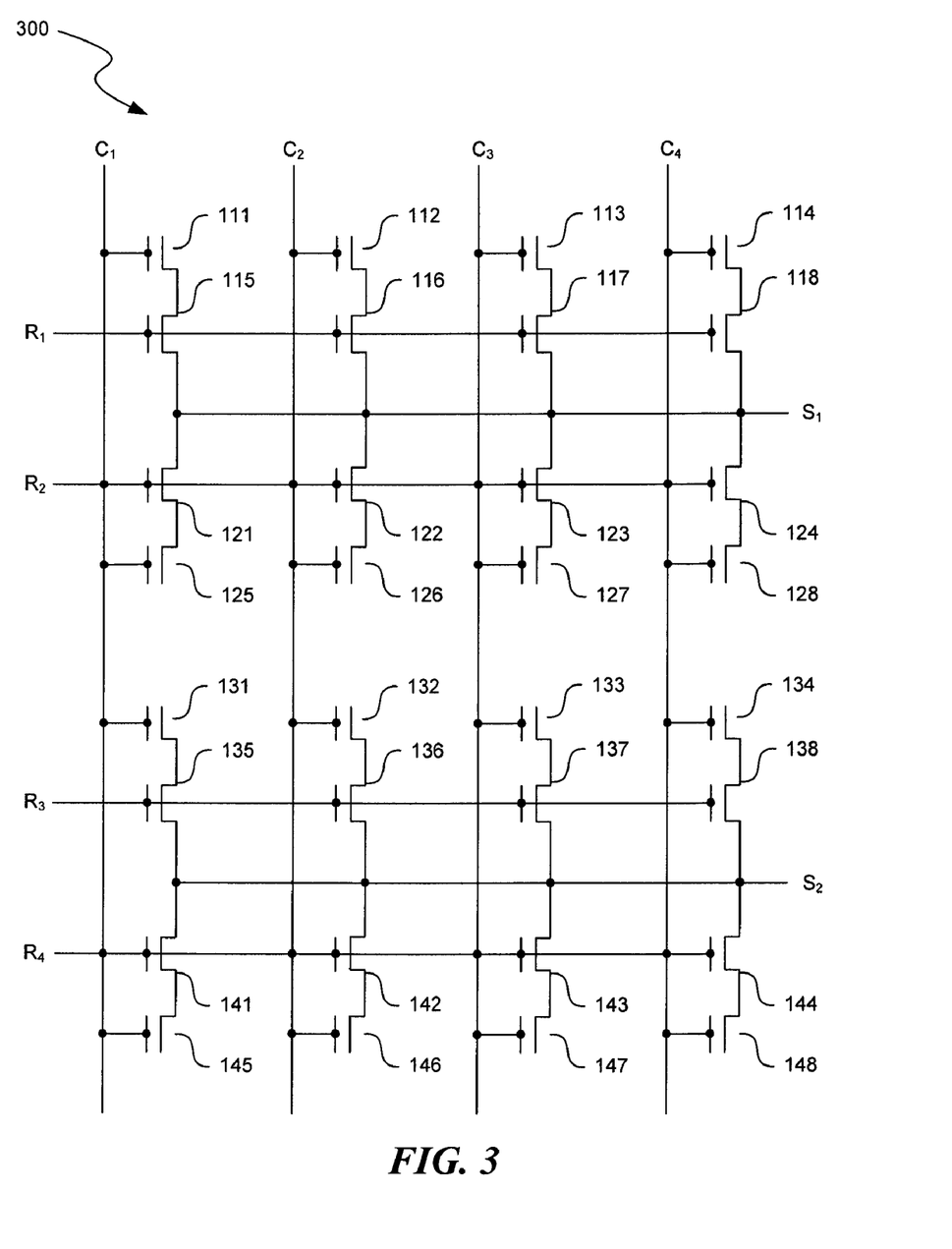
FIG. 3 is a schematic circuit diagram of a 4×4 portion of a memory array using nonvolatile OTP memory units.

As mentioned above, the basic building block of a nonvolatile OTP memory cell with respect to which most of the embodiments of this invention are described has been discussed by Peng and is illustrated in an arbitrary 4×4 array of such units in FIG. 3. In FIG. 3, Peng discloses a nonvolatile OTP memory unit at the crosspoint of the first row $R_1$, and the first column $C_1$ that comprises one n-channel MOS transistor 115 in series with a half-transistor 111, both of which can be fabricated using standard CMOS processes without additional masking. The gate of transistor 115 is connected to the row line $R_1$, its source to the source line $S_1$, and its drain to one terminal of the half-transistor 111. Transistor 115 is also referred to as a select transistor and is used to "select" a particular memory cell for programming or reading.

In Peng's memory cell, 115 acts as a switch and 111 acts as a current limiter, wherein the current passing through 111 is an indication of its programmed logic level (data content). In a read process, appropriate voltage is applied to the gates of 111 and 115 transistors, wherein the application of the voltage to 115 connects 111 to the bit-line bl and the current which is limited by 111 and passes through bl is sensed by a sense amplifier to classify the logic level of the passing current.

Note that if used without the proposed improvements, each time the content of 111 is needed a voltage must be applied to the gate of the 111 half-transitor and be held for a duration dictated by the system.

In Peng's memory cell, the gate of the half-transistor 111 acts as one plate of a capacitor and the application of the voltage to the gate causes an n-type inversion layer to form under the gate which acts as the other plate of the capacitor, and together with the source/drain region forms the second terminal of the capacitor. Since it is undesirable to break down the gate oxide of the select transistor 115, the gate oxide of the select transistor 115 may be made, in some embodiments, to have a thicker gate oxide than that of the half-transistor 111.

During the programming step, a large voltage is applied to the gates of the select transistor 115 and the half-transistor 111 to break down the gate oxide of the half-transistor 111 and to set the leakage current level of the memory cell. The memory cell is read by sensing the current drawn by the cell. Therefore, with this particular memory cell, the concerned stress may be limited to the unprogrammed or, in other words, those transistors which have not been broken down. But the disclosed methods and apparatus can be used whenever reduction of voltage application to a transistor gate is desired.

As described in the embodiments of the present invention a signal of short but enough duration is applied to a desired memory transistor gate, for reading its data content, and while the data is being read it is also latched. At least two goals are achieved by this process.

First, the duration of the exposure of the gate to the voltage during the read process needs to be only long enough to latch the data. There is no need to be concerned about other duration requirements imposed by the system. This is because the system can use the latched data, available at the output of the latch, at least until the next read cycle when the latch content may be changed.

Second, there will be no need to further read this memory transistor as long as the same transistor is being addressed during subsequent reading attempts. In such situations, when the same memory transistor is being addressed, the data content of the memory transistor has already been latched during the previous read cycle and is available at the output of the latch. But if during the cycle right before the present read cycle a different memory transistor has been read, the newly addressed memory transistor must be read and its data content must be latched. Some of the advantages of this invention are longer device life, raised yield, improved reading speed, reduced operating power, and prevention of output fluctuation.

In the following description, several specific details are presented to provide a thorough understanding of the embodiments of the invention. One skilled in the relevant art will recognize, however, that the invention can be practiced without one or more of the specific details, or in combination with or with other components, etc. In other instances, well-known implementations or operations are not shown or described in detail to avoid obscuring aspects of various embodiments of the invention.

The terminology used in the description presented below is intended to be interpreted in its broadest reasonable manner, even though it is being used in conjunction with a detailed description of certain specific embodiments of the invention. Certain terms may even be emphasized below; however, any terminology intended to be interpreted in any restricted manner will be overtly and specifically defined as such in this Detailed Description section.

Reference throughout the specification to "one embodiment" or "an embodiment" means that a particular feature, structure, implementation, or characteristic described in connection with the embodiment is included in at least one embodiment of the present invention. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Pulse Method of Reading a Memory Cell

Figures 4A, 4B:
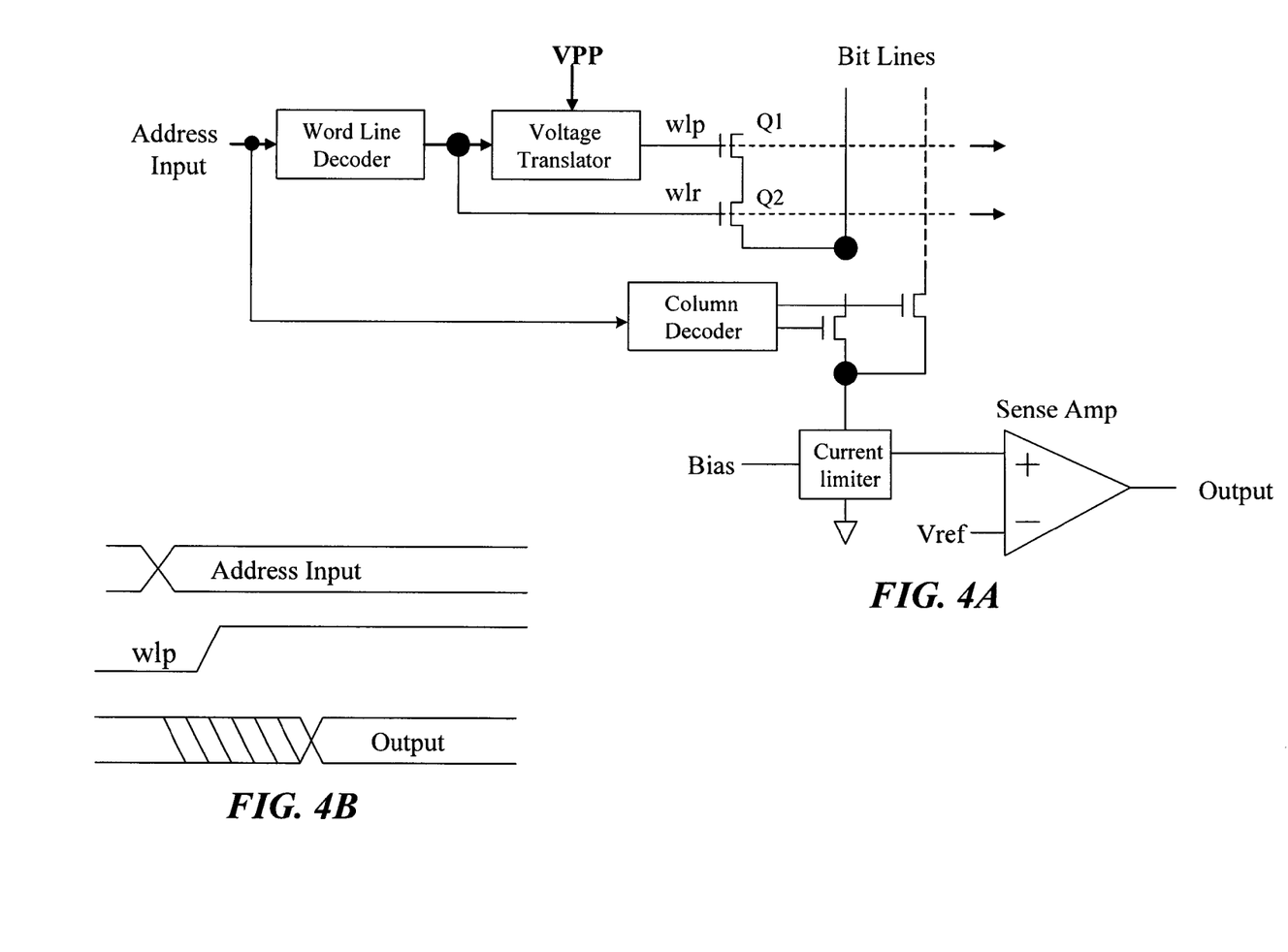
FIG. 4A is a schematic circuit diagram of an OTP memory cell being read in a conventional manner.
FIG. 4B is a timing diagram associated with the conventional read process of FIG. 4A.

FIG. 4A illustrates a typical read process of a memory cell composed of Q1 and Q2 transistors, wherein the operations of Q1 and Q2 are similar to those of 111 and 115 described in FIG. 3. As illustrated in FIG. 4A, in a read process, the desired memory address is decoded in the Word-Line Decoder and the example Q2 transistor is turned ON by "wlr" to connect the example Q1 transistor to its corresponding bit-line "bl." The desired memory address is also decoded in the Column Decoder to further connect the bit-line bl to the ground (via the current limiter). In this condition the Q1 transistor is connected to the ground and when the Voltage Translator exerts an appropriate voltage to its gate, via "wlp," the current passing through Q1 transistor is directed to and sensed by the Sense Amplifier and is classified as a particular logic level. However, the applied voltage also creates stress in the gate oxide of the Q1 transistor.

In general, the duration of the read voltage on the Q1 transistor gate is dictated by different system factors, and each time a read process is required the voltage is applied to the Q1 transistor gate and maintained for a similar duration, and; therefore, a similar stress is exerted on its gate oxide. FIG. 4B is a simplified timing diagram of the memory access and output signals of the read process of FIG. 4A, which shows a long period of voltage application to the Q1 transistor gate.

Figures 5A, 5B:
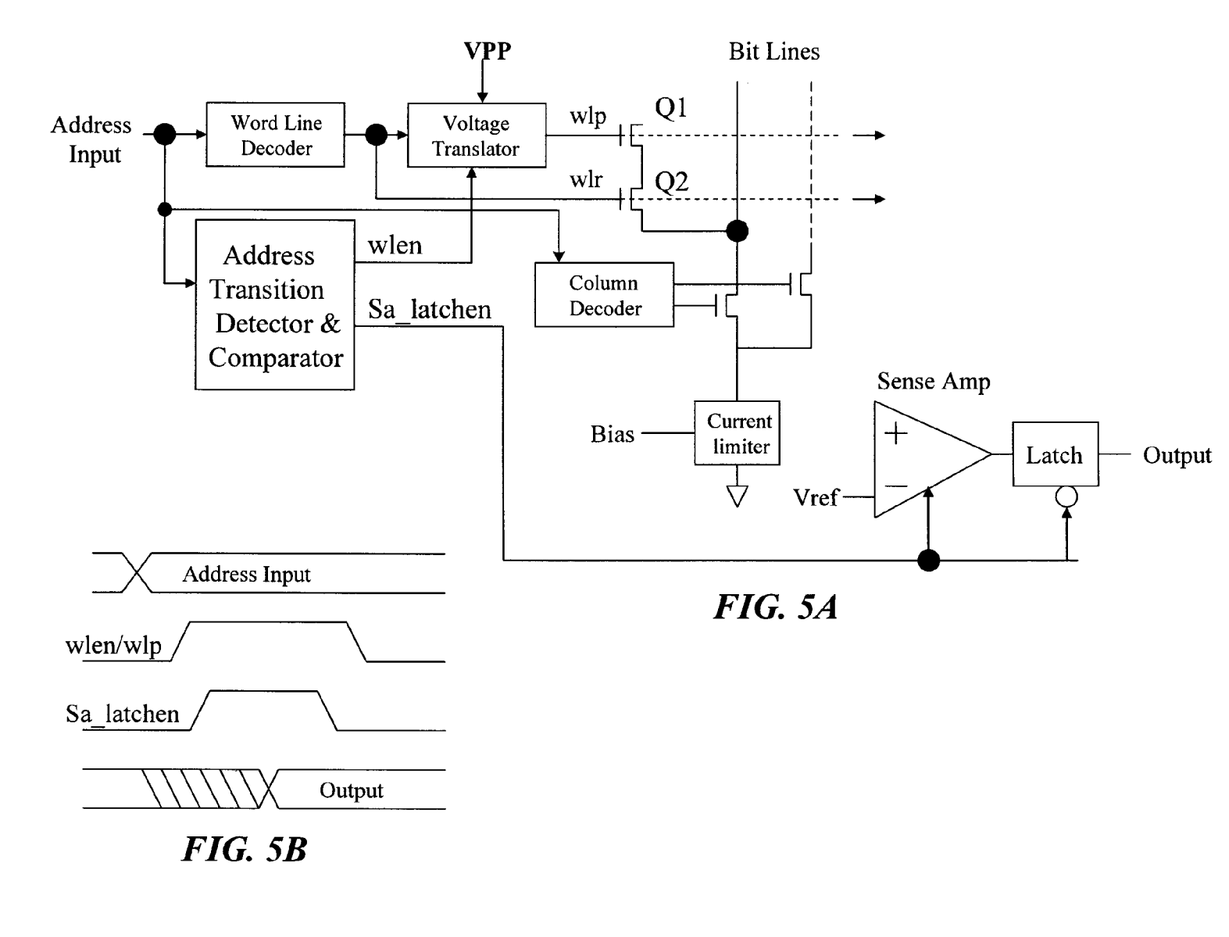
FIG. 5A is a schematic circuit diagram of an OTP memory cell being read in accordance with an embodiment of the invention.
FIG. 5B is a timing diagram associated with the read process and output signals of FIG. 5A.

FIG. 5A illustrates a reading process of the memory cell composed of Q1 and Q2 transistors in accordance with an embodiment of the invention. As illustrated in FIG. 5A, during the read process the desired memory address is decoded in the Word-Line Decoder and the Q2 transistor is turned ON via "wlr" to connect the Q1 transistor to its corresponding bit-line "bl." The address is also decoded in the Column Decoder to further connect the bit-line "bl" to the ground (via the current limiter).

In this arrangement, as in the arrangement of FIG. 4A, the Q1 transistor is connected to the ground; however, in contrast with the conventional read process of FIG. 4A, the Voltage Translator exerts the appropriate voltage to the gate of the Q1 transistor, via "wlp," only if the Address Transition Detector & Comparator indicates that the current memory address is different from the address during the previous cycle. In this case the current passing through Q1 transistor is sensed by the Sense Amplifier, is classified as a particular logic level, and is latched by the Latch. But if the Address Transition Detector & Comparator indicates that the current memory address is the same as the memory address during the previous cycle, the Voltage Translator does not impose any voltage on the gate of the Q1 transistor and the latched value from the previous cycle remains unchanged.

As depicted in FIG. 5A, the Address Transition Detector & Comparator also controls the sense amplifier and the latch. At the same time that it allows the reading of the memory cell and exertion of voltage on Q1, it enables classification of its data content by the sense amplifier and the latching of the classified result.

Similarly if the Address Transition Detector & Comparator does not permit exertion of the read voltage on Q1, it will not enable classification by the sense amplifier and latching.

FIG. 5B shows a timing diagram of the memory access and output signals of the read process of FIG. 5A, in which the wlp exerts a pulse voltage-to the gate of the Q1 transistor, long enough to be latched. In this embodiment there is no need to keep the voltage on the Q1 transistor gate based on the system requirements; rather, the system can use the output of the Latch, which remains available as long as a different memory cell is not read.

Performance Comparison

Figure 6:
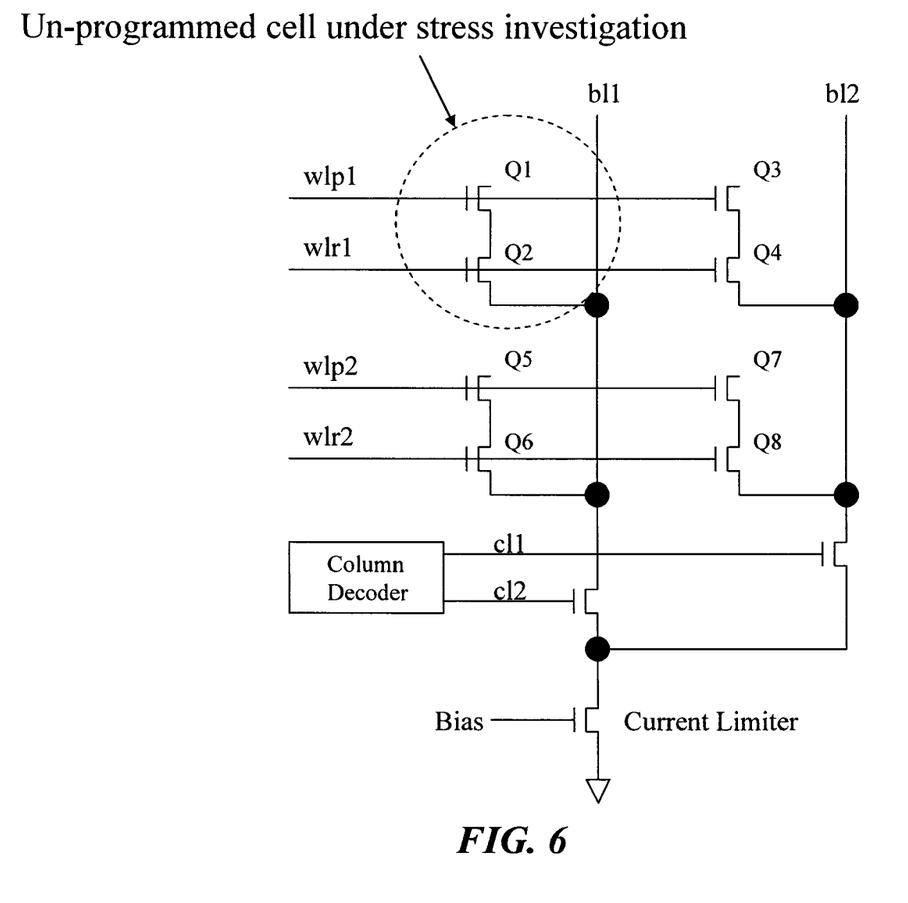
FIG. 6 is a schematic circuit diagram of a 2×2 portion of a memory cell array for analysis of stresses exerted on the cell composed of Q1 and Q2 transistors.

FIG. 6 is a schematic circuit diagram of a 2×2 portion of a memory cell array for analysis and comparison of stresses exerted on one of the cells which is composed of Q1 and Q2 transistors. The subsequent Figures, as will be described in detail, illustrate stress conditions of Q1 during different situations such as if the same memory cell is addressed repeatedly or intermittently for example after at least one other memory cell is addressed.

Figure 7:
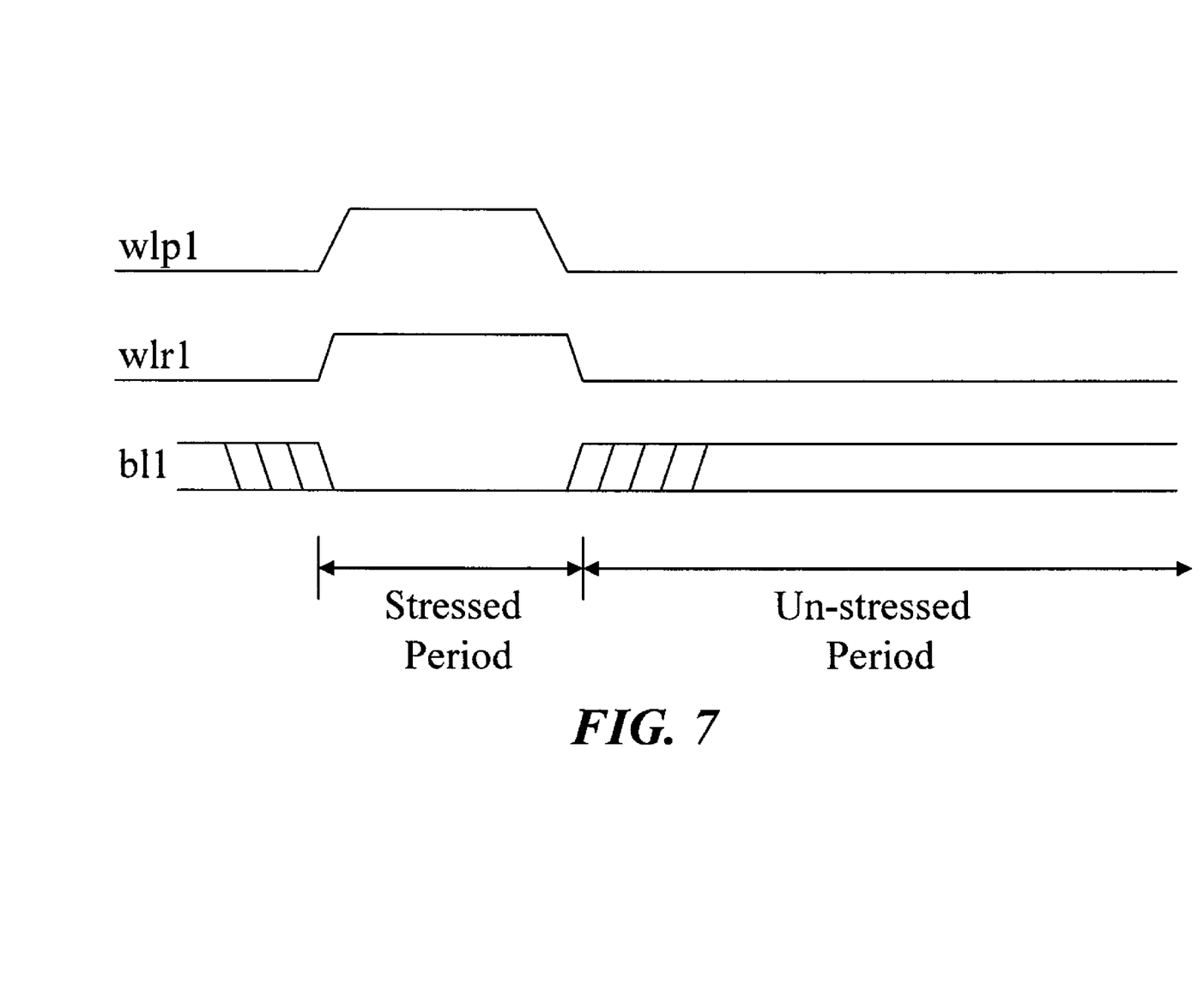
FIG. 7 illustrates timings and related stress periods of the cell of FIG. 6 that is composed of Q1 and Q2 transistors, for a conventional read process.

FIG. 7 illustrates timings and corresponding stress periods of one of the cells of FIG. 6, which is composed of Q1 and Q2 transistors, during a conventional read process, wherein the duration of voltage applications to Q1 and Q2 transistors is a function of the system requirements. FIG. 7 shows that each time the memory cell is read the voltage is applied to the Q1 transistor gate, for the duration of the reading process, and stress is caused for the same duration. The un-stressed period lasts until the memory cell is read again, which may be immediately or after reading several other memory cells.

Figure 8:
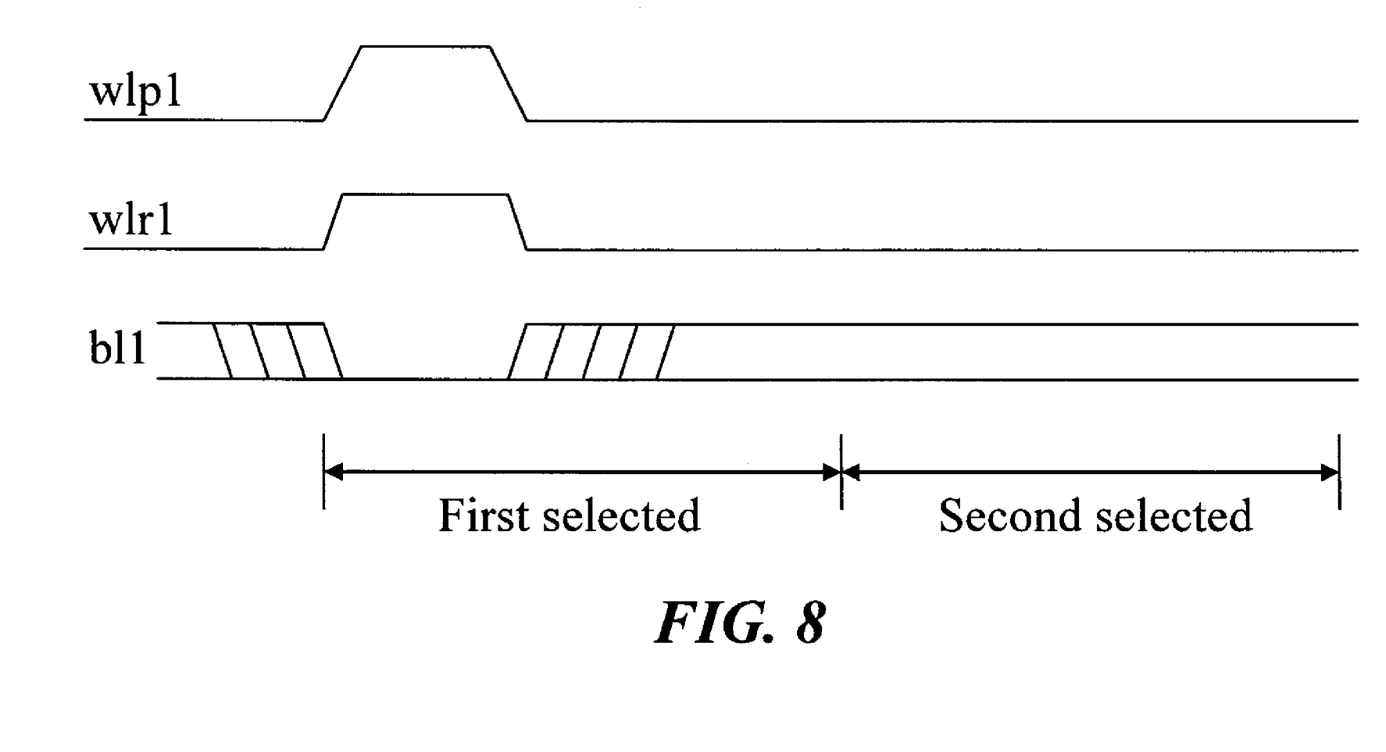
FIG. 8 illustrates timings and related stress periods of the cell of FIG. 6 that is composed of Q1 and Q2 transistors, being read in accordance with an embodiment of the invention.

FIG. 8 illustrates timings and corresponding stress periods of the same cell of FIG. 6 being read in accordance with an embodiment of the invention. In contrast to FIG. 7, FIG. 8 shows that the duration of the reading process and the voltage applied to the Q1 transistor gate are shorter than the ones illustrated in FIG. 7—short enough for the read result to be latched. It also shows that as long as the same memory is selected for reading, no more voltage is applied to the Q1 transistor gate; therefore, stress is substantially reduced on the Q1 transistor gate.

Figure 9:
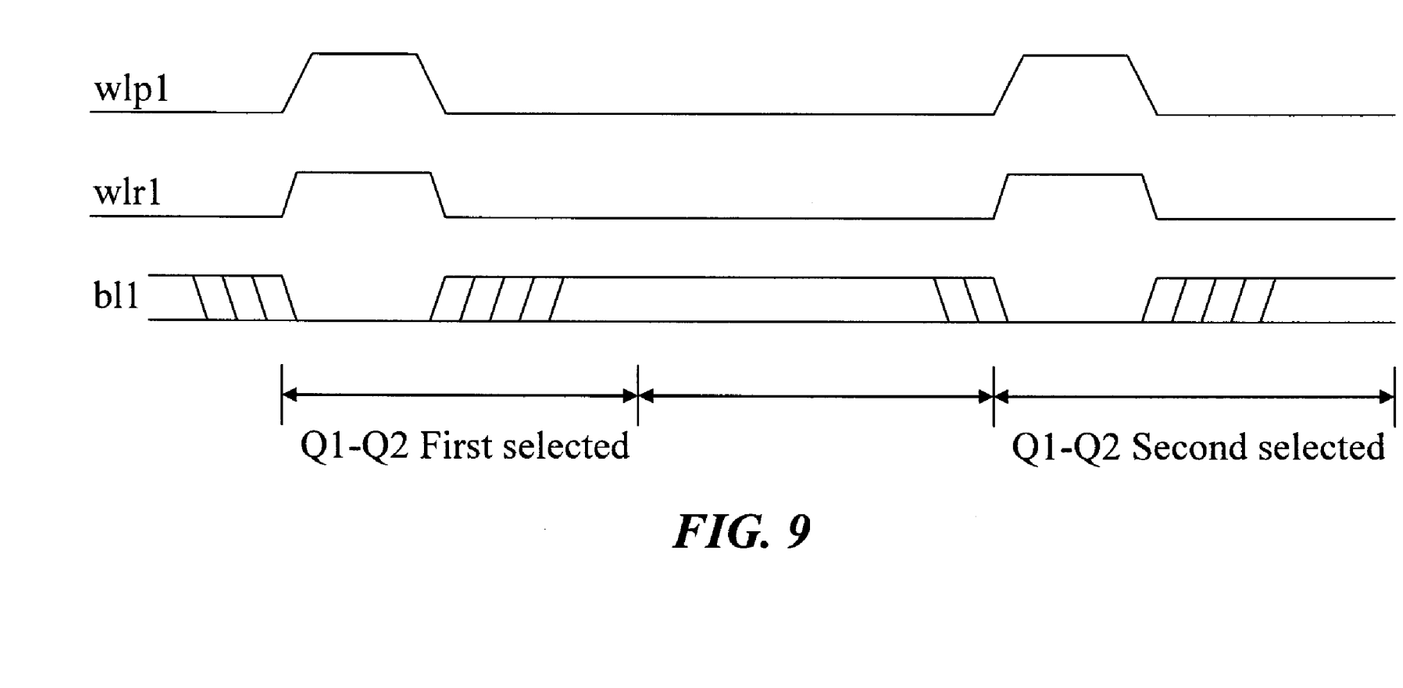
FIG. 9 illustrates timings and related stress periods of the cell of FIG. 6 that is composed of Q1 and Q2 transistors while being read intermittently in accordance with an embodiment of the invention.

FIG. 9 illustrates timings and related stress periods of the same memory cell while being read intermittently. FIG. 9 shows that this memory cell is not read repeatedly, and that other cells have been read between the two readings of this cell. However, those times that this cell is read, the duration of the reading process and the voltage applied to the Q1 transistor gate are still shorter than the periods in a conventional read process. This, by itself, reduces the stress on the Q1 transistor gate by about 40%.

Figure 10:
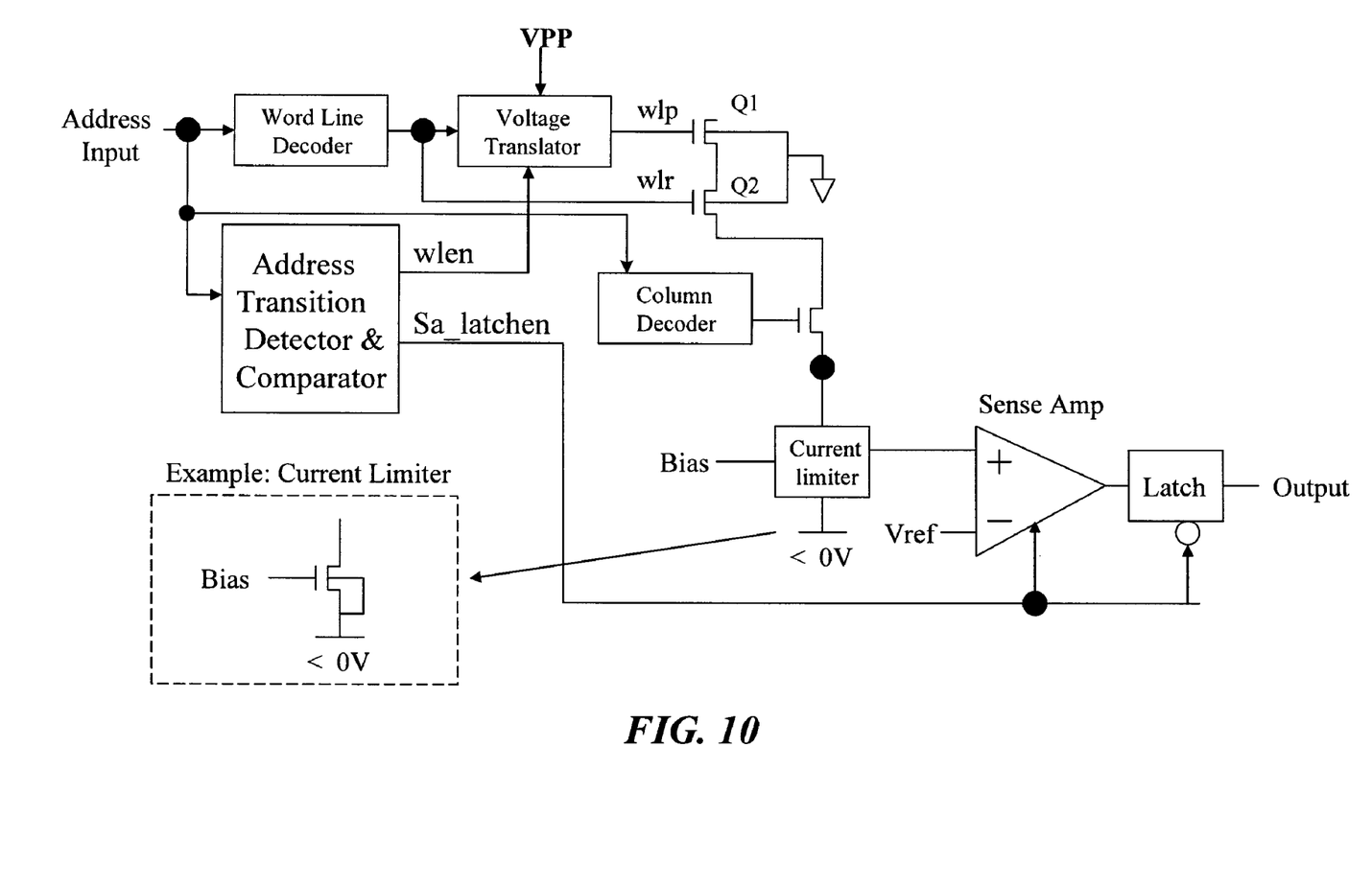
FIG. 10 is a schematic circuit diagram of an OTP memory cell being read in accordance with an alternative embodiment of the invention.

FIG. 10 is a schematic circuit diagram of an OTP memory cell being read in accordance with an alternative embodiment of the invention. This embodiment is similar to the one illustrated in FIG. 5A, but some of the groundings and voltage levels are altered for better reliability. In this alternative embodiment, without increasing the wlp voltage the reading is improved. Furthermore, in this embodiment triple well process that is becoming the default process is used and the current limiter is connected to a negative voltage instead of the ground.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. When the claims use the word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. Also, the teachings of the invention provided herein can be applied to other systems, not necessarily the system described above. The elements and acts of the various embodiments described above can be combined to provide further embodiments.

All of the above patents and applications and other references, including any that may be listed in accompanying filing papers, are incorporated herein by reference. Aspects of the invention can be modified, if necessary, to employ the systems, functions, and concepts of the various references described above to provide yet further embodiments of the invention.

Changes can be made to the invention in light of the above "Detailed Description." While the above description details certain embodiments of the invention and describes the best mode contemplated, no matter how detailed the above appears in text, the invention can be practiced in many ways. Therefore, implementation details may vary considerably while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims. For example, the invention is not limited to AMR.

While certain aspects of the invention are presented below in certain claim forms, the inventors contemplate the various aspects of the invention in any number of claim forms. For example, while only one aspect of the invention is recited as embodied in a computer-readable medium, other aspects may likewise be embodied in a computer-readable medium. Accordingly, the inventors reserve the right to add additional claims after filing the application to pursue such additional claim forms for other aspects of the invention.

The invention claimed is:

1. A method for reducing oxide stress of memory transistors of memory cells in a memory cell array, the method comprising:
   maintaining the address of an addressed memory cell if the addressed memory cell is read, wherein the address is maintained to be used during the next read cycle;
   comparing, at each read cycle, the address of the addressed memory cell with the address maintained from the previous read cycle;
   reading the addressed memory cell and storing its data content if the addressed memory cell has not been read in the previous read cycle; and
   utilizing stored data in place of reading the addressed memory cell if the addressed memory cell data content had been read and stored in the previous read cycle.

2. The method of claim 1, wherein the memory cell data content is stored by a latch.

3. The method of claim 1, wherein the maintaining and comparing of addresses and control of storing data contents are performed by a same component.

4. The method of claim 1, wherein the reading of the addressed memory cells comprises:
   decoding the address of the addressed memory cell;
   applying an appropriate voltage to gates of memory transistors of the memory cells of a row specified by the decoded address;
   applying an appropriate turn-on voltage to gates of switch transistors of the memory cells of the row specified by the decoded address;
   joining a bit-line, which is connected to switch transistors of the memory cells of a column specified by the decoded address, to an output path; and
   classifying the output path signal into a logic level.

5. The method of claim 4, wherein storing the addressed memory cell data content is performed by latching the classified output path signal.

6. The method of claim 4, wherein classifying the output path signal into a logic level is performed by a sense amplifier.

7. An apparatus for reducing number of times memory cells in memory cell arrays are being read, the apparatus comprising:
   means for temporarily keeping the address of an addressed memory cell if the addressed memory cell is read, wherein the address is kept to be used during the next read cycle;
   means for comparing, at each read cycle, the address of the addressed memory cell with the kept address from the previous read cycle;
   means for reading the addressed memory cell and latching its data content if the addressed memory cell has not been read in the previous read cycle; and
   means for utilizing the latched data instead of reading the addressed memory cell if the addressed memory cell data content had been read and latched in the previous read cycle.

8. The method of claim 7, wherein keeping and comparing of addresses and enabling of latching are performed by a same part.

* * * * *